(12) United States Patent
Zhao et al.

(10) Patent No.: US 11,784,467 B2
(45) Date of Patent: Oct. 10, 2023

(54) POWER DISTRIBUTION EQUIPMENT AND POWER DISTRIBUTION SYSTEM

(71) Applicant: Huawei Digital Power Technologies Co., Ltd., Shenzhen (CN)

(72) Inventors: Fugao Zhao, Dongguan (CN); Cheng Ma, Dongguan (CN); Xiaoke Ran, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 157 days.

(21) Appl. No.: 17/352,733

(22) Filed: Jun. 21, 2021

(65) Prior Publication Data
US 2021/0313779 A1 Oct. 7, 2021

Related U.S. Application Data

(63) Continuation of application No. PCT/CN2019/102723, filed on Aug. 27, 2019.

(30) Foreign Application Priority Data

Dec. 21, 2018 (CN) .......................... 201822168343.5

(51) Int. Cl.
*H02B 1/20* (2006.01)
*H05K 7/14* (2006.01)
(Continued)

(52) U.S. Cl.
CPC .............. *H02B 1/20* (2013.01); *H02B 1/04* (2013.01); *H02B 1/46* (2013.01); *H05K 7/1457* (2013.01)

(58) Field of Classification Search
None
See application file for complete search history.

(56) References Cited

U.S. PATENT DOCUMENTS 8,717,744 B2   5/2014   Michaelis et al.
9,041,250 B1 *  5/2015   Czamara ............... G06F 1/26
                                                    307/64
(Continued)

FOREIGN PATENT DOCUMENTS

CN   201369301 Y   12/2009
CN   101854033 A   10/2010
(Continued)

OTHER PUBLICATIONS

Chinese Office Action issued in corresponding Chinese Application No. 201980004276.8, dated Aug. 3, 2020, pp. 1-6.
(Continued)

*Primary Examiner* — Courtney L Smith
(74) *Attorney, Agent, or Firm* — HAUPTMAN HAM, LLP

(57) ABSTRACT

This application discloses power distribution equipment and a power distribution system. The power distribution equipment includes a power distribution device and a power distribution box, where the power distribution device is capable of being inserted into and removed from the power distribution box; a connection port is disposed at a first end of the power distribution device, where the connection port is used to connect a power cable or a user load line; a power connection terminal is disposed at a second end of the power distribution device, where the power connection terminal is used to plug into a busbar inside the power distribution box; and the connection port and the power connection terminal are connected inside the power distribution device. A design in which the power distribution device is capable of being inserted into and removed from the power distribution box simplifies operation and improves convenience.

17 Claims, 7 Drawing Sheets

(51) Int. Cl.
*H02B 1/04* (2006.01)
*H02B 1/46* (2006.01)

(56) References Cited

U.S. PATENT DOCUMENTS

| | | | | |
|---|---|---|---|---|
| 9,301,025 | B2* | 3/2016 | Kioski | H04Q 1/15 |
| 9,722,399 | B2* | 8/2017 | Kushnar | H02B 13/00 |
| 10,455,722 | B1* | 10/2019 | Wildstone | H05K 7/1492 |
| 2007/0217178 | A1* | 9/2007 | Johnson, Jr. | H05K 7/1457 361/826 |
| 2009/0154129 | A1* | 6/2009 | Clark | H05K 7/1425 361/796 |
| 2014/0321067 | A1 | 10/2014 | Leeman et al. | |
| 2015/0009607 | A1 | 1/2015 | Daamen et al. | |
| 2015/0016029 | A1* | 1/2015 | Johnsen | H02B 1/056 361/652 |
| 2015/0180234 | A1 | 6/2015 | Bailey et al. | |
| 2015/0214700 | A1 | 7/2015 | Bergeron et al. | |
| 2015/0234440 | A1* | 8/2015 | Gardner | H05K 7/1492 713/300 |
| 2017/0111451 | A1* | 4/2017 | Thul | H05K 7/1492 |

FOREIGN PATENT DOCUMENTS

| | | |
|---|---|---|
| CN | 202067737 U | 12/2011 |
| CN | 102983044 A | 3/2013 |
| CN | 203387059 U | 1/2014 |
| CN | 203415832 U | 1/2014 |
| CN | 203466551 U | 3/2014 |
| CN | 103926450 A | 7/2014 |
| CN | 103971984 A | 8/2014 |
| CN | 104283117 A | 1/2015 |
| CN | 204179554 U | 2/2015 |
| CN | 104577728 A | 4/2015 |
| CN | 204905681 U | 12/2015 |
| CN | 106505548 A | 3/2017 |
| CN | 106711827 A | 5/2017 |
| CN | 206546997 U | 10/2017 |
| CN | 207082740 U | 3/2018 |
| CN | 107993900 A | 5/2018 |
| CN | 207624637 U | 7/2018 |
| CN | 208209279 U | 12/2018 |
| JP | 2002315156 A | 10/2002 |
| JP | 2004087276 A | 3/2004 |
| JP | 2004147375 A | 5/2004 |
| JP | 2009231942 A | 10/2009 |
| JP | 2015177070 A | 10/2015 |

OTHER PUBLICATIONS

Chinese Office Action issued in corresponding Chinese Application No. 201980004276.8, dated Feb. 22, 2021, pp. 1-5.
Chinese Office Action issued in corresponding Chinese Application No. 201980004276.8, dated Aug. 4, 2021, pp. 1-5.
International Search Report issued in corresponding International Application No. PCT/CN2019/102723, dated Dec. 2, 2019, pp. 1-9.
European Search Report issued in corresponding European Application No. 19901371.5, dated Jan. 3, 2022, pp. 1-31, European Patent Office, Munich, Germany.
Japanese Office Action issued in corresponding Japanese Application No. 2021-536041, dated Jun. 21, 2022, pp. 1-11.
Chinese Office Action issued in corresponding Chinese Application No. 201980004276.8, dated Mar. 3, 2022, pp. 1-7.

* cited by examiner

POWER DISTRIBUTION EQUIPMENT AND POWER DISTRIBUTION SYSTEM

CROSS-REFERENCE TO RELATED APPLICATIONS

This application is a continuation of International Application No. PCT/CN2019/102723, filed on Aug. 27, 2019, which claims priority to Chinese Patent Application No. 201822168343.5, filed on Dec. 21, 2018. The disclosures of the aforementioned applications are hereby incorporated by reference in their entireties.

TECHNICAL FIELD

This application relates to the field of power supply equipment, and in particular, to power distribution equipment and a power distribution system.

BACKGROUND

With the rapid development of network and big data, power distribution cabinets required for communication base stations and data centers are increasingly complex. A power distribution system in a power distribution cabinet is used to supply working power to a base station or server. For example, direct-current distribution in a −48V power supply system in a communication base station is generally based on a −48V busbar, with fuses or circuit breakers connected in series as output protection devices, or with connectors having no protection function configured and directly connected as outputs.

Protection devices may include fuses or circuit breakers.

A fuse is a current protector that melts a fuse wire with heat generated by the fuse itself to break a circuit when a current exceeds a specified value. A circuit breaker is a device that cuts off a circuit when a fault such as severe overload, broken circuit, or undervoltage occurs on power equipment. In a communications power distribution system, a fuse or circuit breaker is typically used as a power distribution device for output protection. In addition, in the power distribution system, a connector having no protection function is also often configured as a power distribution device to directly connect a busbar for distribution output.

FIG. 1 is a main view of power distribution equipment that includes circuit breakers.

In the equipment shown in FIG. 1, a busbar is allocated to each output circuit breaker through a copper clamp. A load end of the circuit breaker implements distribution output through screw connection at a front side. However, the power distribution equipment of this connection structure causes inconvenience in equipment maintenance. When any one circuit breaker becomes faulty and needs to be disassembled and replaced, a screw needs to be loosened, a fastener of a guide rail for the circuit breaker needs to be lifted, and a lower part is pushed forward and then pulled upward. An entire disassembly process takes a relatively long time. A non-specialized person is unable to complete disassembly and replacement of the circuit breaker.

Therefore, in existing power distribution equipment and an existing power distribution system, an operation to disassemble and replace a power distribution device is excessively complex and inconvenient to perform, which affects execution efficiency of troubleshooting.

SUMMARY

To resolve the foregoing problem, this application provides power distribution equipment and a power distribution system, to simplify an operation to disassemble and replace a power distribution device, and improve execution efficiency of troubleshooting for the power distribution system.

According to a first aspect, an embodiment of this application provides power distribution equipment, including a power distribution device and a power distribution box, where the power distribution device is capable of being inserted into and removed from the power distribution box; a connection port is disposed at a first end of the power distribution device, where the connection port is used to connect a power cable or a user load line; a power connection terminal is disposed at a second end of the power distribution device, where the power connection terminal is used to plug into a busbar inside the power distribution box; and the connection port and the power connection terminal are connected inside the power distribution device.

Optionally, the power distribution device is a connector, a fuse, or a circuit breaker.

To prompt an exception inside the power distribution device, optionally, a signal terminal is further disposed at a rear end of the power distribution device, where the signal terminal is used to plug into a signal bar inside the power distribution box, and inside the power distribution device, the connection port is connected to the signal terminal through a resistor and a diode that are connected in series. The signal terminal is plugged into the signal bar disposed inside the power distribution box to output an alarm signal when a connection inside the power distribution device is disconnected, so as to prompt the exception inside the power distribution device.

Optionally, a latch is disposed on one side of the power distribution device, and a square hole corresponding to the latch is disposed in a top cover of the power distribution box. The latch is capable of preventing the power distribution device from being pulled out while the power distribution device is in operation.

Optionally, the power distribution device further includes a pull handle, where the pull handle is disposed at a front end of the power distribution device. When the power distribution device is a circuit breaker or a fuse, an internal mechanism of the pull handle is connected to the power distribution device. When the pull handle is pulled out, the connection port is disconnected from the power connection terminal. When the pull handle is pushed in, the connection port is connected to the power connection terminal. To disassemble and replace the power distribution device of the power distribution equipment, it is not necessary to power off the entire power distribution system. It is merely needed to exert an external force on the pull handle and the power distribution device can be detached from the power distribution box. Therefore, operation continuity of the power distribution system is not affected during disassembly and replacement of the power distribution device of the power distribution equipment provided in this application.

To determine whether the connection between the power distribution device and the power distribution box is effective, optionally, when the power distribution device is a circuit breaker, a closing protection rod is disposed on one side of the power distribution device. When the power distribution device is not inserted into the power distribution box, the closing protection rod is in a free state. When the power distribution device is inserted into the power distribution box, the closing protection rod is compressed by the top cover of the power distribution box.

The closing protection rod is in a free state when the power distribution device is not inserted into the power distribution box or is not inserted in place. In this case, the internal mechanism of the power distribution device is locked and internal contacts are unable to close, which indicates that the connection between the power distribution device and the power distribution box is ineffective. The closing protection rod is compressed by the top cover of the power distribution box when the power distribution device is inserted into the power distribution box. In this case, the power distribution device is inserted in place. The internal mechanism of the power distribution device is unlocked and the internal contacts are able to close and be conductively connected, which indicates that the connection between the power distribution device and the power distribution box is effective. Therefore, the closing protection rod can help determine effectiveness of the connection between the power distribution device and the power distribution box.

Optionally, there are one or two connection ports and one or two power connection terminals.

Optionally, the power distribution device is long strip-shaped.

Optionally, the power distribution equipment includes a plurality of power distribution devices, the plurality of power distribution devices are plugged into the power distribution box in parallel, and power connection terminals of the plurality of power distribution devices share a common busbar, or power connection terminals of the plurality of power distribution devices respectively correspond to different busbars.

Optionally, the power distribution device is installed in a space of one rack unit U for integrated management.

According to a second aspect, an embodiment of this application provides a power distribution system, including the power distribution equipment according to the first aspect, where the power distribution equipment includes at least the following two: first power distribution equipment and second power distribution equipment, where the first power distribution equipment and the second power distribution equipment are stacked vertically, with the first power distribution equipment and the second power distribution equipment wired in a same direction; or the first power distribution equipment and the second power distribution equipment are stacked vertically, with the first power distribution equipment and the second power distribution equipment wired in opposite directions; or the first power distribution equipment and the second power distribution equipment are stacked in a horizontally staggered manner, with the first power distribution equipment and the second power distribution equipment wired in a same direction.

Compared with the prior art, this application has at least the following advantages:

The power distribution equipment according to this application includes a power distribution device and a power distribution box, where the power distribution device is capable of being inserted into and removed from the power distribution box; a connection port is disposed at a first end of the power distribution device, where the connection port is used to connect a power cable or a user load line; a power connection terminal is disposed at a second end of the power distribution device, where the power connection terminal is used to plug into a busbar inside the power distribution box; and the connection port and the power connection terminal are connected inside the power distribution device.

By using the power distribution equipment according to this application, when a power distribution device needs to be disassembled and replaced, it is merely needed to pull out the faulty power distribution device to detach the power connection terminal of the power distribution device from the busbar, and then insert a new power distribution device into a corresponding position in the power distribution box to plug the power connection terminal of the power distribution device into the busbar and connect the connection port of the power distribution device to a power cable or a user load line. Then, disassembly and replacement of the power distribution device are completed. It can be learned that in the power distribution equipment according to this application, a design in which the power distribution device is capable of being inserted into and removed from the power distribution box simplifies operation and improves convenience. Even a non-specialized person is able to complete the operation. Disassembly and replacement of the power distribution device can be completed within a relatively short period of time, significantly improving execution efficiency of troubleshooting for the power distribution equipment. In addition, the connection port is disposed at the first end of the power distribution device, and the first end may be a front end of the power distribution device that faces a user, making the connection port visible to the user. As a result, operation convenience of maintenance for the power distribution equipment is further improved.

BRIEF DESCRIPTION OF DRAWINGS

To describe the technical solutions in the embodiments of this application or in the prior art more clearly, the following briefly describes the accompanying drawings for describing the embodiments or the prior art. Apparently, the accompanying drawings in the following description show merely some embodiments of this application, and a person of ordinary skill in the art may still derive other drawings from these accompanying drawings without creative efforts.

DESCRIPTION OF EMBODIMENTS

Based on the foregoing descriptions, when a power distribution device in an existing power distribution equipment becomes faulty and needs to be disassembled and replaced, an operation is very inconvenient. It takes a long time, has a relatively high requirement on professional capabilities of working personnel, and affects execution efficiency of system troubleshooting.

To resolve this problem, this application provides power distribution equipment and a related power distribution system. The power distribution equipment includes a power distribution device and a power distribution box, where the power distribution device is capable of being inserted into and removed from the power distribution box; a connection port is disposed at a first end of the power distribution device, where the connection port is used to connect a power cable or a user load line; a power connection terminal is disposed at a second end of the power distribution device, where the power connection terminal is used to plug into a busbar inside the power distribution box; and the connection port and the power connection terminal are connected inside the power distribution device.

By using the power distribution equipment according to this application, when a power distribution device needs to be disassembled and replaced, it is merely needed to pull out the faulty power distribution device to detach its power connection terminal from the busbar, and then insert a new power distribution device into a corresponding position in the power distribution box to plug its power connection terminal into the busbar and connect its connection port to a power cable or a user load line. Disassembly and replacement of the power distribution device are completed. It can be learned that in the power distribution equipment according to this application, a design in which the power distribution device is capable of being inserted into and removed from the power distribution box simplifies operation and improves convenience. Even a non-specialized person is able to complete the operation. Disassembly and replacement of the power distribution device can be completed within a relatively short period of time, significantly improving execution efficiency of troubleshooting for the power distribution equipment.

To make a person skilled in the art understand the technical solutions in this application better, the following clearly describes the technical solutions in the embodiments of this application with reference to the accompanying drawings in the embodiments of this application. Apparently, the described embodiments are merely some rather than all of the embodiments of this application. All other embodiments obtained by a person of ordinary skill in the art based on the embodiments of this application without creative efforts shall fall within the protection scope of this application.

Figure 2:
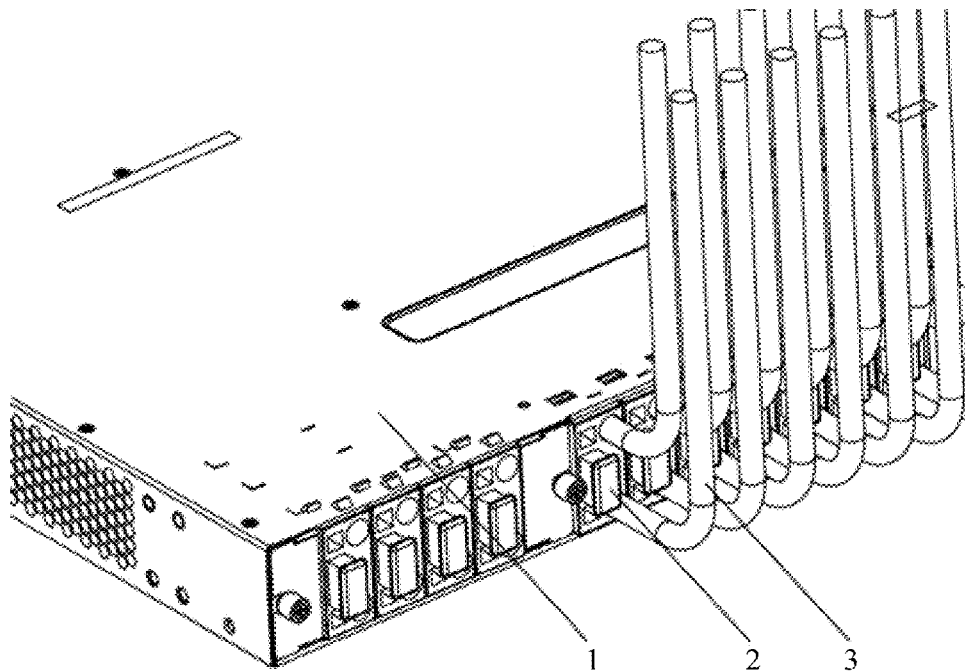
FIG. 2 is a schematic structural diagram of power distribution equipment according to this application.
Figure 3:
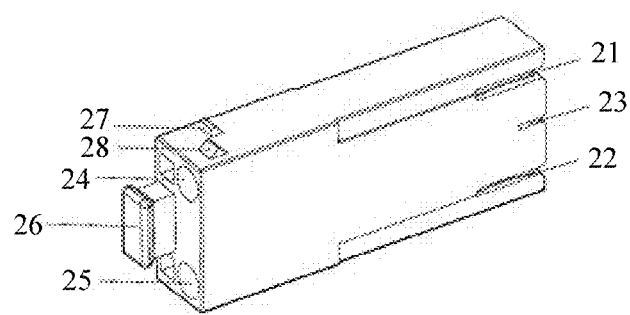
FIG. 3 is a schematic structural diagram of a power distribution device according to this application.
Figure 4:
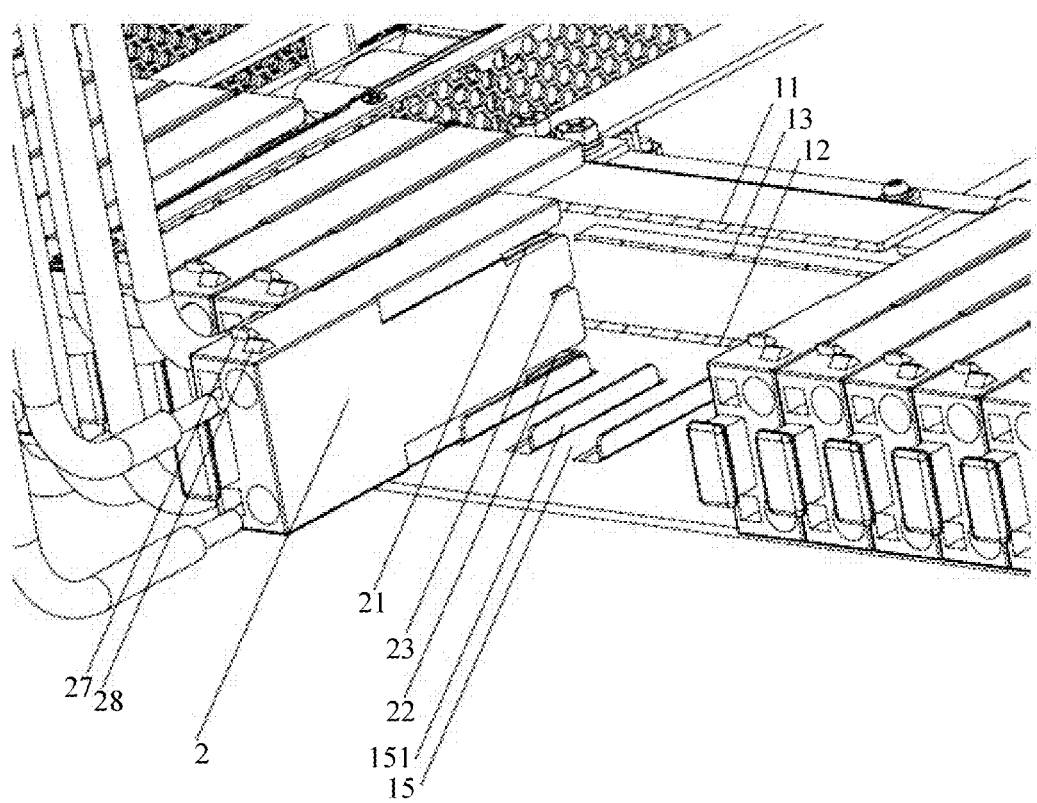
FIG. 4 is a schematic assembly diagram of power distribution equipment according to this application.

FIG. 2 is a schematic structural diagram of power distribution equipment according to an embodiment of this application. FIG. 3 is a schematic structural diagram of a power distribution device according to an embodiment of this application. FIG. 4 is a schematic assembly diagram of power distribution equipment according to an embodiment of this application.

Referring to FIG. 2 to FIG. 4, the power distribution equipment according to an embodiment of this application includes:

a power distribution box 1 and a power distribution device 2, where the power distribution device 2 is capable of being inserted into and removed from the power distribution box 1. FIG. 2 shows a connection state in which the power distribution device 2 is inserted into the power distribution box 1.

The power distribution device in this embodiment of this application may a front-access-cabled plug-in type electric connector, a front-access-cabled plug-in type circuit breaker, or a front-access-cabled plug-in type fuse. The power distribution device may be long strip-shaped. One end of the power distribution device is called a first end, and the other end is called a second end. The following describes the power distribution device and the power distribution equipment by using an example in which the first end is a front end of the power distribution device that faces a user, and the second end is a rear end of the power distribution device that faces away from the user.

A connection port 24 is disposed at the front end of the power distribution device 2, where the connection port 24 is used to connect a power cable or a user load line 3.

A power connection terminal 21 is disposed at the rear end of the power distribution device 2. The power connection terminal 21 is used to plug into a busbar inside the power distribution box 1.

The connection port 24 and the power connection terminal 21 are connected inside the power distribution device 2.

Because the connection port and the power connection terminal are connected inside the power distribution device, a quantity of connection ports is the same as a quantity of power connection terminals. The following describes in detail an implementation in which the power distribution device 2 has two connection ports and two power connection terminals.

The power distribution device 2 has the connection port 24 and a connection port 25, and the power connection terminal 21 and a power connection terminal 22. Inside the power distribution device, the connection port 24 is connected to the power connection terminal 21, and the connection port 25 is connected to the power connection terminal 22.

To prompt an exception inside the power distribution device, in a possible implementation, a signal terminal 23 is further disposed at the rear end of the power distribution device according to this application. The signal terminal 23 is used to plug into a signal bar inside the power distribution box 1.

A latch 27 is disposed on one side of the power distribution device 2. A pull handle 26 is disposed at the front end of the power distribution device 2. A closing protection rod 28 is disposed on one side of the power distribution device 2.

It should be noted that in this embodiment, the busbar and the signal bar each may be made of a conductive material. For example, the busbar may be a copper busbar, and the signal bar may be a copper signal bar. In this embodiment, specific materials of the busbar and the signal bar are not limited.

By using the power distribution equipment according to this application, when a power distribution device needs to be disassembled and replaced, it is merely needed to pull out the faulty power distribution device to detach its power connection terminal from the busbar, and then insert a new power distribution device into a corresponding position in the power distribution box to plug its power connection terminal into the busbar and connect its connection port to a power cable or a user load line. Disassembly and replacement of the power distribution device are completed. It can be learned that in the power distribution equipment according to this application, a design in which the power distribution device is capable of being inserted into and removed from the power distribution box simplifies operation and improves convenience. Even a non-specialized person is able to complete the operation. Disassembly and replacement of the power distribution device can be completed within a relatively short period of time, significantly improving execution efficiency of troubleshooting for the power distribution equipment. In addition, the connection port is disposed at the first end (such as the front end of the power distribution device that faces the user) of the power distribution device, making the connection port visible to the user. As a result, operation convenience of maintenance for the power distribution equipment is further improved.

It can be understood that in actual application, there may be one or more connection ports in the power distribution device according to this embodiment based on a need of a power distribution system. For a direct-current power distribution system, when the power distribution device has only one connection port, the connection port may be used to connect to DC+ or DC−. When the power distribution device has two connection ports, the two connection ports are respectively used to connect to DC+ and DC−. For an alternating-current power distribution system, when the power distribution device has only one connection port, the connection port may be used to connect to L or N. When the power distribution device has two connection ports, the two connection ports are respectively used to connect to L and N. It should be noted that for a power distribution device that has only one connection port, polarity of the connection port is defined by the system. If a system busbar is of negative voltage, the connection port is connected to DC− of a direct-current power source or an N pole of an alternating-current power source. If a system busbar is of positive voltage, the connection port is connected to DC+ of a direct-current power source or an L pole of an alternating-current power source.

Figure 1:
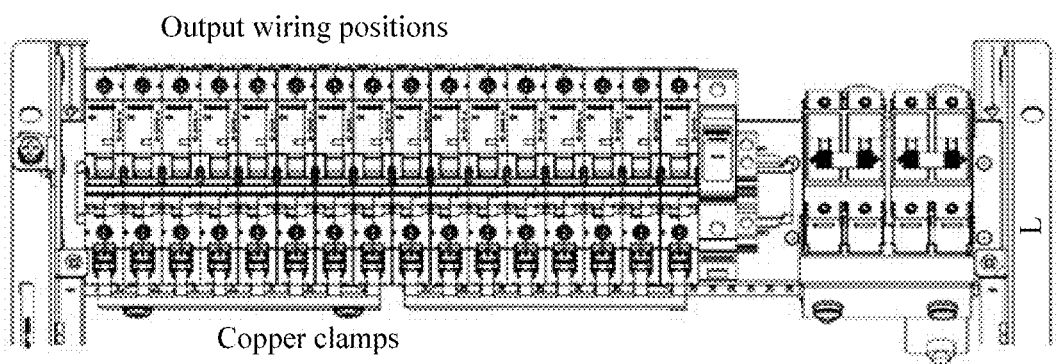
FIG. 1 is a main view of power distribution equipment that includes circuit breakers.

In some existing technical solutions, positive and negative poles of a power distribution system are not connected to the same device. For example, in power distribution equipment that includes pyromagnetic circuit breakers as shown in FIG. 1, the circuit breaker itself can provide only one output connection position, which may be positive or negative. To meet a connection requirement for the other polarity, an additional power distribution device is required. In addition, to implement front access cabling for the circuit breaker, an additional terminal is required in a front panel, which occupies a space in the front panel and increases structural complexity and costs. In the power distribution device according to this embodiment of this application, two connection ports 24 and 25 are disposed at the front end, making connection convenient and meeting a connection requirement for two polarities. In addition, the connection ports 24 and 25 are disposed at the front end of the power distribution device, which requires no additional terminals in the front panel, thereby saving a space in the front panel and decreasing structural complexity of the equipment.

For ease of understanding, the following describes an assembly relationship of the power distribution equipment with reference to FIG. 4.

As shown in FIG. 4, a busbar 11 and a busbar 12 are disposed in parallel inside a power distribution box. In actual operation, a power distribution device 2 is inserted into the power distribution box. A power connection terminal 21 and a power connection terminal 22 of the power distribution device 2 are respectively engaged with the busbar 11 and the busbar 12. An elastic contact piece inside a power power distribution device 21 is elastically plugged into top and bottom surfaces of the busbar 11, and a spring contact piece inside a power power distribution device 22 is elastically plugged into top and bottom surfaces of the busbar 12. In this way, a stable electric connection is formed between the power distribution device 2 and the power distribution box.

In actual application, current may flow from the power distribution device to the busbars, or may flow from the busbars to the power distribution device.

A signal bar 13 is further disposed inside the power distribution box. A signal terminal 23 of the power distribution device 2 is plugged into the signal bar 13 disposed inside the power distribution box to output an alarm signal when a connection inside the power distribution box is disconnected.

An L-shaped guide piece 151 is disposed on a bottom cover 15 of the power distribution box. The guide piece 151 is used to guide an insertion direction or a pulling direction of the power distribution device 2 when the power distribution device 2 is inserted into the power distribution box or pulled out from the power distribution box.

It can be understood that the power distribution device can be long strip-shaped as shown in FIG. 3 and FIG. 4, and certainly can be of another shape. A specific shape of the power distribution device in the power distribution equipment is not limited in this embodiment of this application.

It can be understood that in this embodiment, the power distribution device may be a power distribution device not configured with a circuit protection function and is used merely as a device with a connection function, such as a connector. Certainly, the power distribution device may alternatively be a power distribution device configured with a circuit protection function, such as circuit breaker or a fuse. For ease of understanding, the following provides an implementation of the power distribution device with a circuit protection function.

When the power distribution device is a circuit breaker or a fuse, the power distribution device is capable of implementing a circuit protection function against overload and short circuit.

Figure 5:
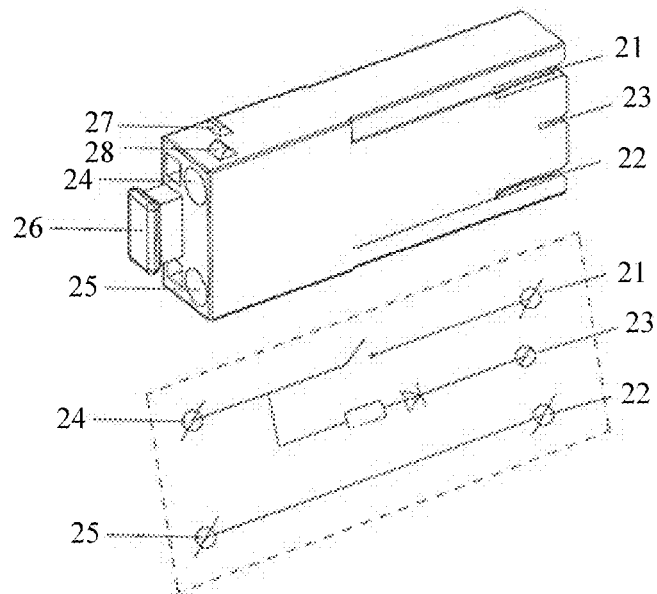
FIG. 5 is a schematic diagram of internal electric connection of a power distribution device according to this application.

This embodiment further provides an implementation of an electric connection relationship between a connection port and a signal terminal inside a power distribution device. Specifically, FIG. 5 is a schematic diagram of internal electric connection of a power distribution device according to this application. FIG. 5 visually shows a connection relationship between a connection port 24, and a power connection terminal 21 and a signal terminal 23 inside the power distribution device 2, and a connection relationship between a connection port 25 and a power connection terminal 22 inside the power distribution device 2. As shown in FIG. 5, inside the power distribution device, the connection port 24 is connected to the signal terminal 23 through a resistor and a diode that are connected in series.

For the power distribution equipment shown in FIG. 1, because of a manner of connection between a circuit breaker, and a busbar and a load end, when a circuit breaker becomes faulty and needs to be disassembled and replaced by a maintenance worker, a tool and a structure piece are prone to be short-circuited to a live part, endangering personal safety. Therefore, with an existing structure of the power distribution equipment, safe replacement cannot be implemented while the system is in operation. Each time when the circuit breaker is faulty and needs to be disassembled and replaced, the entire power distribution system needs to be powered off, which interferes with continuous work of the power distribution system.

To further resolve this problem, the power distribution equipment according to this application can implement safe disassembly and replacement of the power distribution device without powering off the power distribution system. The following describes an implementation of the power distribution device with reference to FIG. 6.

Figure 6:
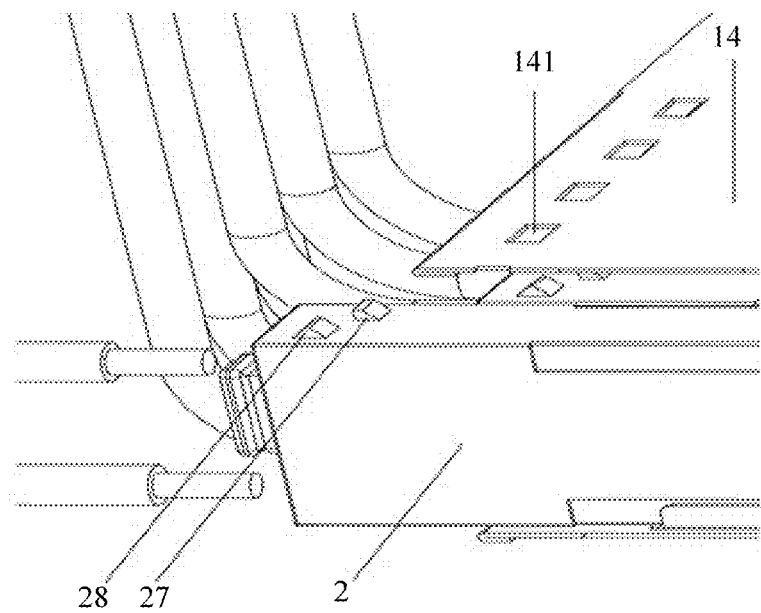
FIG. 6 is a schematic assembly diagram of power distribution equipment according to this application.

FIG. 6 is a schematic assembly diagram of power distribution equipment according to an embodiment of this application.

A pull handle 26 is disposed at a front end of a power distribution device 2. An internal mechanism of the pull handle 26 can be connected to the power distribution device. When the power distribution device 2 is a circuit breaker or a fuse, a connection port is disconnected from a power connection terminal when the pull handle 26 is pulled out, and the connection port is connected to the power connection terminal when the pull handle 26 is pushed in.

In this embodiment of this application, one or more square holes 141 may be disposed in a top cover 14 of a power distribution box. A latch 27 on each power distribution device may correspond to the square hole in the top cover 14 of the power distribution box. It can be understood that a quantity of square holes 141 in the top cover 14 of the power distribution box may be greater than or equal to a total quantity of latches 27 on the power distribution device accommodated by the power distribution box.

In actual application, before contacts inside the power distribution device 2 are disconnected, the latch 27 fits in the square hole 141 and cannot be compressed by the top cover 14. This prevents the power distribution device 2 from being pulled out while the power distribution device is in operation. The latch 27 can be compressed downward to be detached from the square hole 141 only when a pull handle 26 of the power distribution device 2 is pulled with an external force and the contacts inside the power distribution device 2 are disconnected. The power distribution device 2 can be entirely pulled out from the power distribution box.

It can be learned that the power distribution equipment according to this application implements safe pulling-out of the power distribution device by using the pull handle 26, the latch 27, and the square hole 141 that is in the top cover of the power distribution box and that fits with the latch 27. In this application, to disassemble and replace the power distribution device of the power distribution equipment, it is not necessary to power off the entire power distribution system. It is merely needed to exert an external force on the pull handle 26 and the power distribution device 2 can be detached from the power distribution box. Therefore, operation continuity of the power distribution system is not affected during disassembly and replacement of the power distribution device of the power distribution equipment provided in this application.

It can be understood that the latch 27 in this embodiment can be of a shape shown in FIG. 6, or can be of another shape. Correspondingly, the hole 141 that is in the top cover 14 of the power distribution box and that fits with the latch 27 can be of another hole shape except a square.

In the power distribution equipment according to this application, the power distribution device is connected to the power distribution box in a plug-in type. The power distribution equipment can be put into normal use only when the power distribution device is effectively inserted into the power distribution box. Therefore, how to determine effectiveness of a connection between the power distribution device and the power distribution box is a point that needs to be clarified during application of the power distribution equipment.

To determine whether the connection between the power distribution device 2 and the power distribution box is effective, a closing protection rod 28 is disposed on one side of the power distribution device 2 in the power distribution equipment according to this application.

The following provides descriptions in which the power distribution device 2 is a circuit breaker. The closing protection rod 28 is in a free state when the power distribution device 2 (a circuit breaker) is not inserted into the power distribution box or is not inserted in place. In this case, an internal mechanism of the power distribution device 2 is locked and internal contacts are unable to close, which indicates that the connection between the power distribution device 2 and the power distribution box is ineffective. The closing protection rod 28 is compressed by the top cover 14 of the power distribution box when the power distribution device 2 is inserted into the power distribution box. In this case, the power distribution device is inserted in place. The internal mechanism of the power distribution device 2 is unlocked and the internal contacts are able to close and be conductively connected, which indicates that the connection between the power distribution device 2 and the power distribution box is effective.

It should be noted that the power distribution equipment provided in this embodiment supports a plurality of power distribution devices connected in parallel to be plugged into the power distribution box. As shown in FIG. 4, power connection terminals of a plurality of power distribution devices share a common busbar. A power connection terminal 21 of each power distribution device shares a common busbar 11, and a power connection terminal 22 of each power distribution device shares a common busbar 12. It can be understood that in actual application, in the power distribution equipment provided in this embodiment, power connection terminals 21 of a plurality of power distribution devices may be alternatively plugged into different busbars 11, and power connection terminals 22 of the plurality of power distribution devices may be alternatively plugged into different busbars 12. For example, power connection terminals 21 of power distribution devices K1 to K3 are plugged into one busbar 11, and power connection terminals 21 of power distribution devices K4 to K6 are plugged into another busbar 11. Power connection terminals 22 of power distribution devices K1 to K3 are plugged into one busbar 12, and power connection terminals 22 of power distribution devices K4 to K6 are plugged into another busbar 12. In this embodiment, a specific quantity of busbars 11 and busbars 12 is not limited.

Certainly, if a signal terminal 23 is disposed on the power distribution device, signal terminals of the power distribution devices can be jointly plugged into a signal bar 13 inside the power distribution box.

Existing technical solutions for power distribution equipment generally do not support a flexible increase in a quantity of power distribution devices. If a full quantity of circuit breakers and power distribution devices are configured at delivery, the power distribution equipment is certainly unable to guarantee full use of the power distribution devices in all application scenarios, resulting in a waste of the circuit breaker and power distribution device configurations. However, if no circuit breaker or power distribution device is configured, a power box needs to be removed first for expansion installation. In the technical solution provided in this embodiment, the power distribution box and the power distribution device in the power distribution equipment are in pluggable connection. In addition, a plurality of power distribution devices can be plugged in parallel into the power distribution box. Therefore, the power distribution equipment can support a flexible increase or decrease of a quantity of power distribution devices and avoid a waste of resources caused by a fixed configuration.

Figure 7:
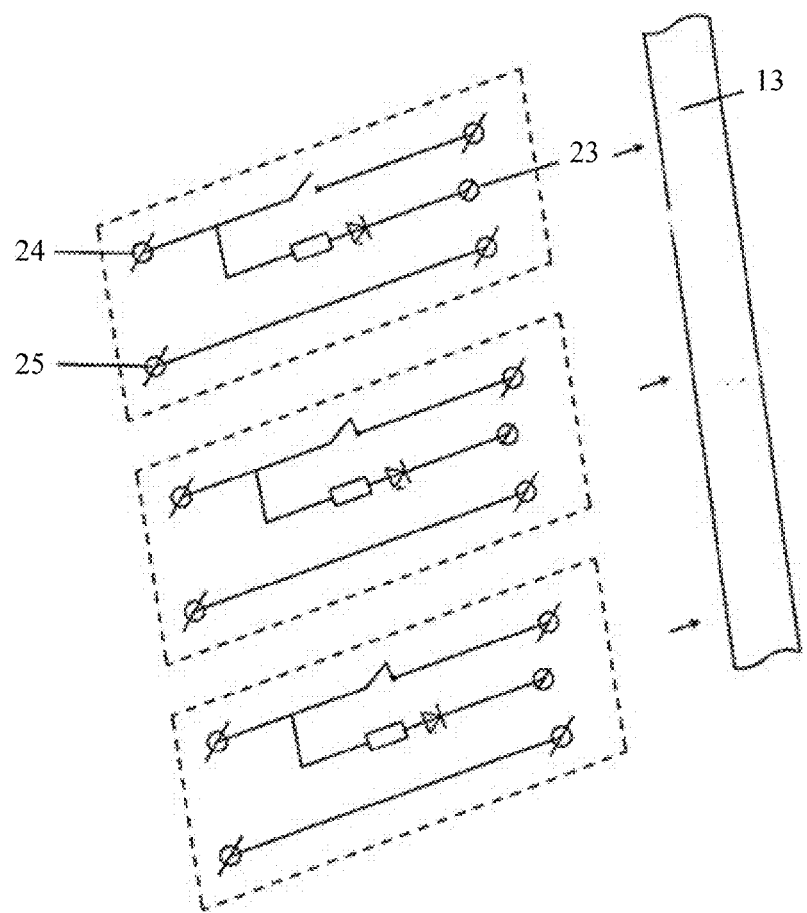
FIG. 7 is a schematic diagram of internal electric connection of power distribution devices in parallel connection according to this application.

If internal electric connection of each power distribution device is shown in FIG. 5, internal electric connection of each power distribution device connected in parallel may be shown in FIG. 7. Signal terminals 23 of all power distribution devices are plugged into a common signal bar 13. A resistor and a diode that are connected in series are disposed between a connection port 24 and the signal terminal 23 of each power distribution device. In addition, diodes inside the power distribution devices are connected in the same direction. When any power distribution device connected in parallel becomes faulty, voltage of the signal bar 13 may change. Therefore, fault alarming can be implemented by monitoring the voltage of the signal bar 13.

Figure 8:
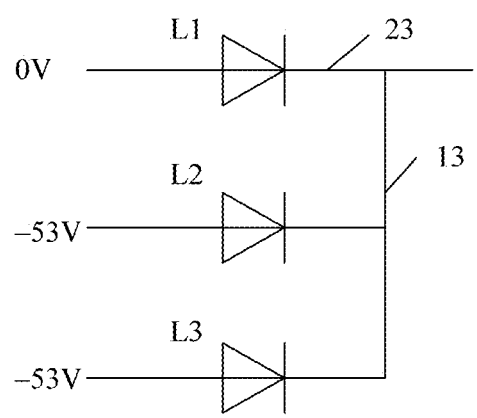
FIG. 8 is a schematic diagram of circuit-closed alarming according to this application.

For ease of understanding of a circuit-closed alarming principle, the following provides descriptions by using examples with reference to the schematic diagram of circuit-closed alarming shown in FIG. 8.

FIG. 8 is schematic diagram of circuit-closed alarming according to an embodiment of this application.

In FIG. 8, if a topmost power distribution device is disconnected internally, voltage on the left side of a diode L1 of the power distribution device becomes 0V, and voltage on the left sides of diodes L2 and L3 of remaining power distribution devices remains normal at −53V. Therefore, the topmost diode L1 is turned on, and voltage of a signal bar 13 becomes close to 0V. In this case, a voltage exception can be identified by monitoring the voltage of the signal bar 13, and it can be further determined that there is a faulty power distribution device in a plurality of power distribution devices connected to the signal bar.

In a possible implementation, a light hole may be disposed in a housing of a power distribution device. When a diode inside the power distribution device is a light-emitting diode, and the light-emitting diode is turned on, light emitted by the light-emitting diode can prompt working personnel through the light hole. The light-emitting diode is on and emits light, indicating that a connection port is disconnected from a power connection terminal inside the power distribution device to which the light-emitting diode belongs. The working personnel can identify a faulty power distribution device based on illuminance of the light hole, and pull out the faulty power distribution device from the power distribution box.

Figure 9:
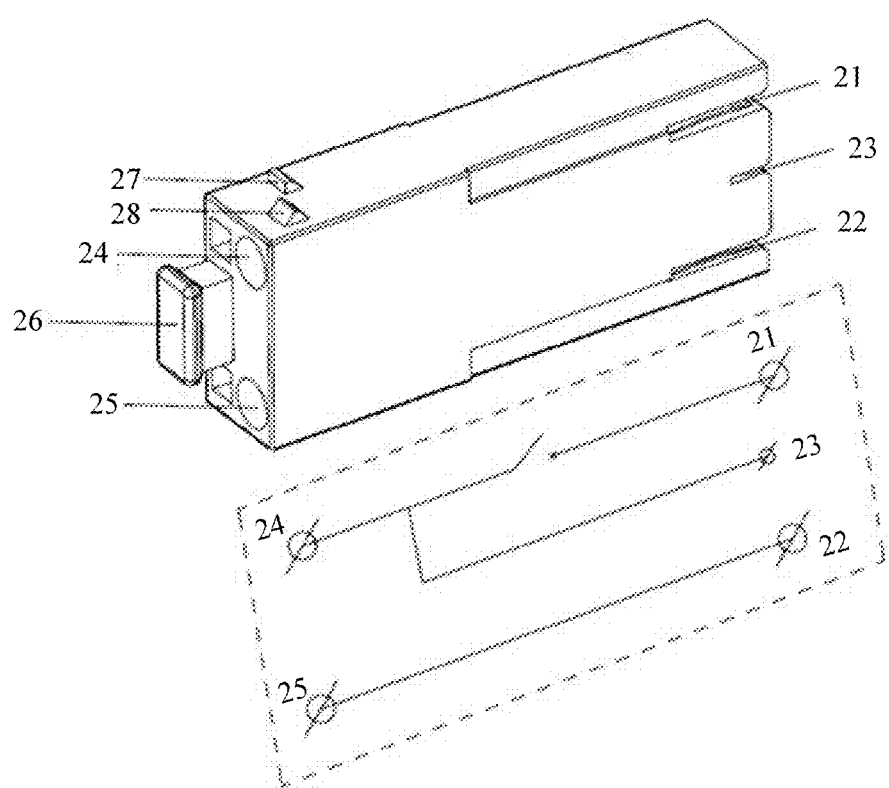
FIG. 9 is a schematic diagram of another internal electric connection of a power distribution device according to this application.
Figure 10:
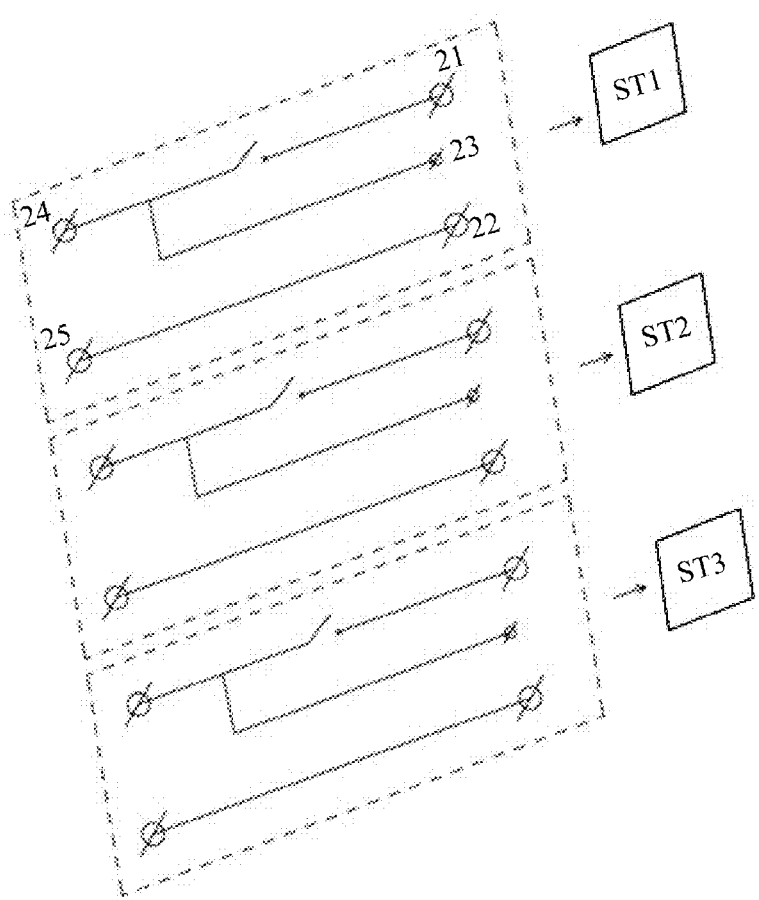
FIG. 10 is a schematic diagram of another internal electric connection of power distribution devices connected in parallel according to this application.

It can be understood that the resistor and diode that are connected in series between the connection port 24 and the signal terminal 23 as shown in FIG. 5 are both optional devices rather than required devices. The connection port 24 and the signal terminal 23 may be directly connected. FIG. 9 is a schematic diagram of another internal electric connection of a power distribution device according to this application. If internal electric connections of the power distribution devices are all as shown in FIG. 9, an internal electric connection of a power distribution device connected in parallel may be shown in FIG. 10. Similar to the foregoing embodiment, in this embodiment, signal terminals 23 of a plurality of power distribution devices connected in parallel are respectively plugged into independent signal terminals ST1, ST2, and ST3. When voltage is generated on any signal terminal, it indicates that a circuit exception occurs in a power distribution device corresponding to the signal terminal.

A unit used by Electronics Industry Alliance for measurement of equipment in equipment rooms such as servers and network switches is called a rack unit. One rack unit is called "1U", and 1U is 44.45 mm in height. In some existing technical solutions for power distribution equipment, power distribution equipment occupies a relatively large space in height and is usually higher than 44.45 mm, and thereby is unable to meet a high density requirement within a 1U space. However, because of the design of pluggable connection between the power distribution device and the power distribution box, the power distribution equipment according to this application effectively saves a space in height and further can implement high-density distribution within a 1U space.

Based on the power distribution equipment provided in the foregoing embodiments, this application accordingly further provides a power distribution system. The power distribution system includes at least two pieces of power distribution equipment according to the foregoing embodiments.

By using the power distribution equipment in the power distribution system, when a power distribution device needs to be disassembled and replaced, it is merely needed to pull out the faulty power distribution device to detach its power connection terminal from a busbar, and then insert a new power distribution device into a corresponding position in a power distribution box to plug its power connection terminal into the busbar and connect its connection port to a power cable or a user load line. Disassembly and replacement of the power distribution device are completed. It can be learned that in the power distribution system according to this application, a design in which the power distribution device is capable of being inserted into and removed from the power distribution box simplifies operation and improves convenience. Even a non-specialized person is able to complete the operation. Disassembly and replacement of the power distribution device can be completed within a relatively short period of time, significantly improving execution efficiency of troubleshooting for the power distribution equipment. In addition, the connection port is disposed at a first end of the power distribution device, and the first end may be a front end of the power distribution device that faces a user, making the connection port visible to the user. As a result, operation convenience of maintenance for the power distribution equipment is further improved.

In addition, if a pull handle and a latch are disposed on the power distribution device of the power distribution equipment, and a square hole corresponding to the latch is disposed in the power distribution box, the power distribution device in the power distribution system can be safely pulled out. Therefore, in this application, to disassemble and replace the power distribution device of the power distribution equipment, it is not necessary to power off the entire power distribution system. It is merely needed to exert an external force on the pull handle and the power distribution device can be detached from the power distribution box. As a result, operation continuity of the power distribution system is not affected during disassembly and replacement of the power distribution device of a system provided in this application.

In actual application, power distribution equipment in the power distribution system according to this application may use a plurality of wiring manners. The following describes, with reference to the accompanying drawings, several example wiring manners according to this application. It should be noted that a wiring wire specifically refers to a power cable or the user load line 3 at the first end of the power distribution equipment (see FIG. 2).

In the following examples, the power distribution system includes at least two pieces of power distribution equipment. Specifically for example, the power distribution system includes two pieces of power distribution equipment (first power distribution equipment and second power distribution equipment).

Example of a First Wiring Manner:

In this example, the first power distribution equipment and the second power distribution equipment of the power distribution system are stacked vertically, with the first power distribution equipment and the second power distribution equipment wired in a same direction.

For example, the first power distribution equipment and the second power distribution equipment are both wired upward or wired downward.

Example of a Second Wiring Manner:

In this example, the first power distribution equipment and the second power distribution equipment are stacked vertically, with the first power distribution equipment and the second power distribution equipment wired in opposite directions.

Figure 11:
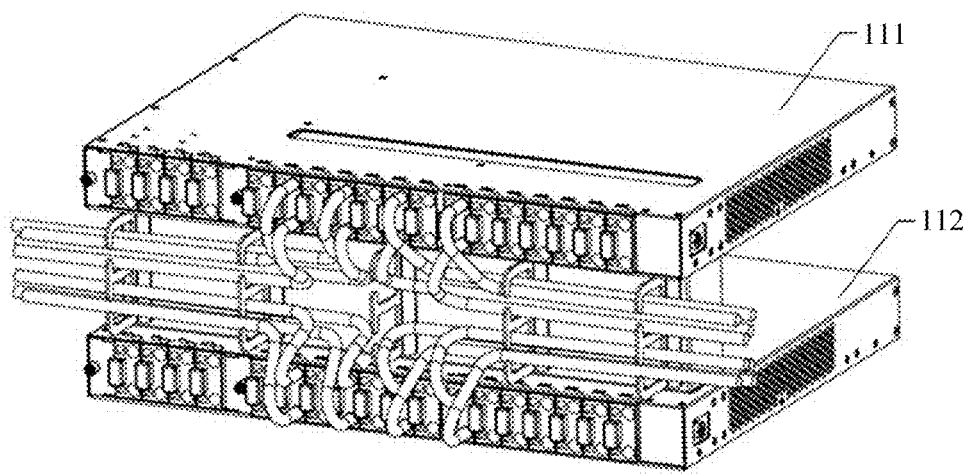
FIG. 11 is a schematic diagram of a wiring manner of a power distribution system according to this application.

FIG. 11 is a schematic diagram of a wiring manner of a power distribution system according to this application.

As shown in FIG. 11, the system includes two pieces of power distribution equipment: first power distribution equipment 111 and second power distribution equipment 112. The first power distribution equipment 111 and the second power distribution equipment 112 are stacked vertically, with the first power distribution equipment 111 disposed over the second power distribution equipment 112. A power cable or a user load line of the first power distribution equipment 111 is wired downward, and a power cable or a user load line of the second power distribution equipment 112 is wired upward.

Example of a Third Wiring Manner:

In this example, the first power distribution equipment and the second power distribution equipment are stacked in a horizontally staggered manner, with the first power distribution equipment and the second power distribution equipment wired in a same direction.

Figure 12:
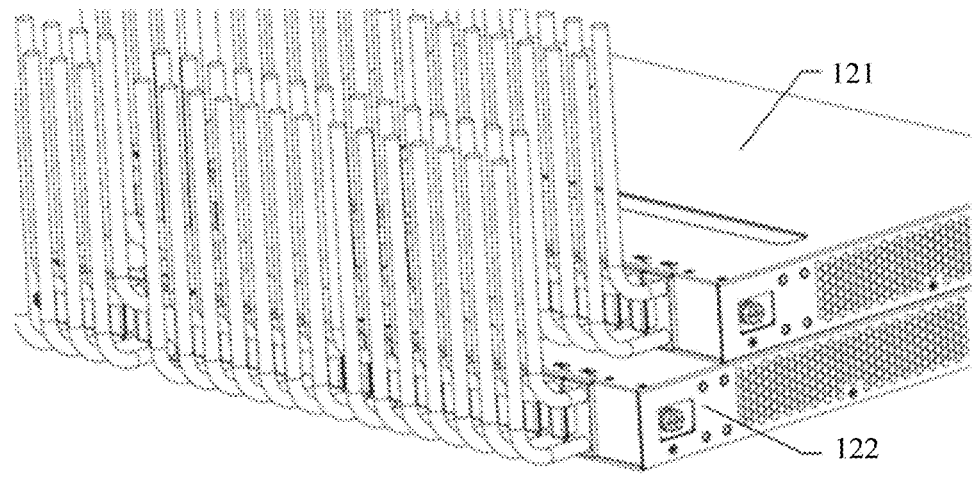
FIG. 12 is a schematic diagram of another wiring manner of a power distribution system according to this application.

FIG. 12 is a schematic diagram of another wiring manner of a power distribution system according to this application.

As shown in FIG. 12, the system includes two pieces of power distribution equipment: first power distribution equipment 121 and second power distribution equipment 122. The first power distribution equipment 121 and the second power distribution equipment 122 are stacked in a horizontally staggered manner, with the first power distribution equipment 121 and the second power distribution equipment 122 both wired upward.

It can be understood that the two pieces of power distribution equipment shown in FIG. 12 can alternatively be both wired downward by changing their staggered positions.

Certainly, the foregoing three manners are merely example wiring manners. In actual application, another wiring manner may be alternatively selected based on a space. Wiring manners of the power distribution equipment in the power distribution system are not specifically limited in this application.

It should be understood that in this application, "at least one" means one or more, and "plurality" means at least two. "And/or" is used to describe an association relationship between associated objects, and indicates that three relationships may exist. For example, "A and/or B" may indicate the following three cases: only A exists, both A and B exist, and only B exists, where A and B may be singular or plural. The character "/" generally indicates an "or" relationship between the associated objects before and after the character. "At least one of the following" or a similar expression thereof indicates any combination of the following, and includes any combination of one or more of the following. For example, at least one of a, b, or c may indicate: a, b, c, "a and b", "a and c", "b and c", or "a and b and c", where a, b, and c may be singular or plural.

The foregoing descriptions are merely example embodiments of this application, but are not intended to limit this application in any way. Although the example embodiments of this application are disclosed above, the embodiments are not intended to limit this application. By using the method and the technical content disclosed above, any persons of ordinary skill in the art can make a plurality of possible changes and modifications on the technical solutions of this application, or amend the technical solutions thereof to be embodiments with equal effects through equivalent variations without departing from the protection scope of the technical solutions of this application. Therefore, any simple amendments, equivalent variations, and modifications made on the above embodiments according to the technical essence of this application without departing from the content of the technical solutions of this application shall fall within the protection scope of the technical solutions of this application.

What is claimed is:

1. Power distribution equipment, comprising a power distribution device and a power distribution box, wherein
   the power distribution device is capable of being inserted into and removed from the power distribution box;
   a connection port is disposed at a first end of the power distribution device, wherein the connection port is used to connect a power cable or a user load line;
   a power connection terminal is disposed at a second end of the power distribution device, wherein the power connection terminal is used to plug into a busbar inside the power distribution box;
   a signal terminal is further disposed at a rear end of the power distribution device, wherein
   the signal terminal is used to plug into a signal bar inside the power distribution box, and inside the power distribution device, the connection port is connected to the signal terminal through a resistor and a diode that are connected in series; and
   the connection port and the power connection terminal are connected inside the power distribution device.

2. The power distribution equipment according to claim 1, wherein
   the power distribution device is a connector, a fuse, or a circuit breaker.

3. The power distribution equipment according to claim 1, wherein a latch is disposed on one side of the power distribution device, and
   a square hole corresponding to the latch is disposed in a top cover of the power distribution box.

4. The power distribution equipment according to claim 2, wherein the power distribution device further comprises a pull handle, wherein
   the pull handle is disposed at a front end of the power distribution device; and
   if the power distribution device is a circuit breaker, an internal mechanism of the pull handle is connected to the circuit breaker, and when the pull handle is pulled out, the connection port is disconnected from the power connection terminal, or when the pull handle is pushed in, the connection port is connected to the power connection terminal.

5. The power distribution equipment according to claim 2, wherein when the power distribution device is a circuit breaker, a closing protection rod is disposed on one side of the power distribution device, wherein when the power distribution device is not inserted into the power distribution box, the closing protection rod is in a free state, or when the power distribution device is inserted into the power distribution box, the closing protection rod is compressed by the top cover of the power distribution box.

6. The power distribution equipment according to claim 1, wherein there are one or two connection ports and one or two power connection terminals.

7. The power distribution equipment according to claim 1, wherein the power distribution device is long strip-shaped.

8. The power distribution equipment according to claim 1, wherein the power distribution equipment comprises a plurality of power distribution devices, the plurality of power distribution devices are plugged into the power distribution box in parallel, and power connection terminals of the plurality of power distribution devices share a common busbar, or power connection terminals of the plurality of power distribution devices respectively correspond to different busbars.

9. The power distribution equipment according to claim 1, wherein the power distribution device is installed in a space of one rack unit U.

10. Power distribution equipment, comprising a power distribution device and a power distribution box, wherein
the power distribution device is capable of being inserted into and removed from the power distribution box;
a connection port is disposed at a first end of the power distribution device, wherein the connection port is used to connect a power cable or a user load line;
a power connection terminal is disposed at a second end of the power distribution device, wherein the power connection terminal is used to plug into a busbar inside the power distribution box;
a latch is disposed on one side of the power distribution device;
a square hole corresponding to the latch is disposed in a top cover of the power distribution box; and
the connection port and the power connection terminal are connected inside the power distribution device.

11. The power distribution equipment according to claim 10, wherein the power distribution device is a connector, a fuse, or a circuit breaker.

12. The power distribution equipment according to claim 10, wherein the power distribution device is a circuit breaker, and the power distribution device further comprises a pull handle, wherein
the pull handle is disposed at a front end of the power distribution device;
an internal mechanism of the pull handle is connected to the circuit breaker; and
when the pull handle is pulled out, the connection port is disconnected from the power connection terminal, or when the pull handle is pushed in, the connection port is connected to the power connection terminal.

13. The power distribution equipment according to claim 10, wherein the power distribution device is a circuit breaker, and a closing protection rod is disposed on one side of the power distribution device, wherein
when the power distribution device is not inserted into the power distribution box, the closing protection rod is in a free state, or when the power distribution device is inserted into the power distribution box, the closing protection rod is compressed by the top cover of the power distribution box.

14. The power distribution equipment according to claim 10, wherein there are one or two connection ports and one or two power connection terminals.

15. The power distribution equipment according to claim 10, wherein the power distribution device is long strip-shaped.

16. The power distribution equipment according to claim 10, wherein the power distribution equipment comprises a plurality of power distribution devices, the plurality of power distribution devices are plugged into the power distribution box in parallel, and power connection terminals of the plurality of power distribution devices share a common busbar, or power connection terminals of the plurality of power distribution devices respectively correspond to different busbars.

17. The power distribution equipment according to claim 10, wherein the power distribution device is installed in a space of one rack unit.

* * * * *

UNITED STATES PATENT AND TRADEMARK OFFICE
CERTIFICATE OF CORRECTION

PATENT NO. : 11,784,467 B2  
APPLICATION NO. : 17/352733  
DATED : October 10, 2023  
INVENTOR(S) : Fugao Zhao Page 1 of 1

It is certified that error appears in the above-identified patent and that said Letters Patent is hereby corrected as shown below:

On the Title Page

Item (73) Assignee, Please change "HUAWEI TECHNOLOGIES CO., LTD." to --HUAWEI DIGITAL POWER TECHNOLOGIES CO., LTD.--.

Signed and Sealed this  
Twenty-sixth Day of November, 2024

Katherine Kelly Vidal  
*Director of the United States Patent and Trademark Office*